US011718519B2

(12) United States Patent
Ghidoni

(10) Patent No.: US 11,718,519 B2
(45) Date of Patent: Aug. 8, 2023

(54) PACKAGED ENVIRONMENTAL SENSOR

(71) Applicant: STMicroelectronics S.r.l., Agrate Brianza (IT)

(72) Inventor: Marco Omar Ghidoni, Melzo (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 38 days.

(21) Appl. No.: 17/102,973

(22) Filed: Nov. 24, 2020

(65) Prior Publication Data

US 2021/0163283 A1 Jun. 3, 2021

(30) Foreign Application Priority Data

Nov. 29, 2019 (IT) .......................... 102019000022503

(51) Int. Cl.
| | |
|---|---|
| *B81B 7/00* | (2006.01) |
| *B81B 7/02* | (2006.01) |
| *B81C 1/00* | (2006.01) |

(52) U.S. Cl.
CPC .... *B81B 7/0058* (2013.01); *B81B 2201/0264* (2013.01); *B81B 2201/0278* (2013.01); *B81B 2201/0292* (2013.01); *B81B 2207/012* (2013.01); *B81B 2207/07* (2013.01); *B81B 2207/092* (2013.01)

(58) Field of Classification Search
CPC .................................................. B81B 7/0058
See application file for complete search history.

(56) References Cited

U.S. PATENT DOCUMENTS

| | | | |
|---|---|---|---|
| 6,927,482 B1 | 8/2005 | Kim et al. | |
| 2009/0314095 A1 | 12/2009 | Lu | |
| 2015/0123737 A1* | 5/2015 | Yokoo | H10N 30/50 331/34 |
| 2016/0241953 A1* | 8/2016 | Elian | B81B 7/0061 |
| 2018/0148323 A1* | 5/2018 | Ghidoni | B81C 1/00182 |
| 2018/0149538 A1* | 5/2018 | Gritti | G01L 19/0092 |
| 2019/0043797 A1* | 2/2019 | Tan | H01L 23/24 |
| 2019/0233278 A1 | 8/2019 | Robert | |
| 2020/0377364 A1* | 12/2020 | Shiraishi | B81B 7/0077 |

* cited by examiner

*Primary Examiner* — Omar F Mojaddedi
(74) *Attorney, Agent, or Firm* — Seed IP Law Group LLP

(57) ABSTRACT

A packaged environmental sensor includes a supporting structure and a sensor die, which incorporates an environmental sensor and is arranged on a first side of the supporting structure. A control chip is coupled to the sensor die and is arranged on a second side of the supporting structure opposite to the first side. A lid is bonded to the first side of the supporting structure and is open towards the outside in a direction opposite to the supporting structure. The sensor die is housed within the lid.

20 Claims, 3 Drawing Sheets

PACKAGED ENVIRONMENTAL SENSOR

BACKGROUND

Technical Field

The present disclosure relates to a packaged environmental sensor.

Description of the Related Art

As is known, environmental sensors are sensors that enable detection of magnitudes of the external environment, such as pressure or humidity. The fields of use of environmental sensors are extremely varied. Among other applications, there has recently been a widespread use of environmental sensors in so-called wearable devices, such as watches, bracelets, and smartbands, which also enable detection of body parameters.

An environmental sensor normally comprises a sensor die, for example of a MEMS (MicroElectroMechanical System) type, and a control circuit, integrated in a separate control chip, also referred to as ASIC (Application-Specific Integrated Circuit) chip. The sensor die and the control chip are enclosed within a packaging structure (normally referred to as package), which comprises a supporting structure, normally of ceramic, and a lid. Defined in the supporting structure is a cavity, in which the sensor die and the control chip are housed. The sensor die is normally stacked on the control chip. The lid is arranged so as to close partially the cavity and has a detection port that enables coupling of the sensor die with the external environment to enable measurement of the magnitude to be detected. In other cases, the cavity can be defined between the supporting structure and the lid, for example thanks to the shape of the lid itself. The cavity is, moreover, as a rule, filled with a protective material, for example a potting gel, which has the property of transmitting the magnitude to be detected, at the same time preventing direct exposure of the sensor and of the control chip to the external environment, which may be harmful for the electronic components and the electrical connections, such as the bonding wires. Also in the case of devices commonly used as wearable devices, in fact, environmental sensors may be exposed to aggressive agents, for example chlorine in the water of a swimming pool, seawater, mineral oils or substances present on the skin, such as sweat or some perfumes. If, for the sensor die and for the control device, an acceptable level of protection can frequently be obtained with just the gel, there, however, arises the problem of sealing also the device in which the environmental sensor is incorporated. Between the environmental sensor and the casing of the device a gap is, in fact, present, which should be sealed to prevent entry of aggressive agents. The task is rendered problematical by the packaging structures of known environmental sensors. Known solutions use gaskets and a shell, which encloses both the sensor and the gaskets, keeping them pre-loaded. Other solutions use complex metal lids, with a dome-shaped portion that covers the control chip (having an area that is much greater than that of the sensor die) and is radiused to a substantially cylindrical neck. The neck has the dual function of guaranteeing coupling of the sensor die with the external environment and of defining a sealing surface for receiving the gasket (O-ring or the like). The solution, however, presents limits both because the lid is complex and costly to produce and on account of the problems that arise during the soldering step. In fact, the potting material has a coefficient of thermal expansion that is much greater than that of the material forming the lid. During soldering, the potting material may exert on the dome-shaped portion forces that tend to detach the lid from the supporting structure. The result is a substantial risk of failure or weakening of the connection between the lid and the supporting structure.

BRIEF SUMMARY

In various embodiments, the present disclosure provides a packaged environmental sensor that will enable the limitations described to be overcome or at least mitigated.

In at least one embodiment of the present disclosure, a packaged environmental sensor is provided that includes a supporting structure and a sensor die incorporating an environmental sensor and arranged on a first side of the supporting structure. A control chip is coupled to the sensor die and arranged on a second side of the supporting structure opposite to the first side. A lid is bonded to the first side of the supporting structure and open towards the outside in a direction opposite to the supporting structure, the sensor die being housed inside the lid.

In at least one embodiment, an electronic system is provided that includes a casing and a processing unit within the casing. A packaged environmental sensor is coupled to the processing unit. The packaged environmental sensor includes a supporting structure and a sensor die incorporating an environmental sensor and arranged on a first side of the supporting structure. A control chip is coupled to the sensor die and arranged on a second side of the supporting structure opposite to the first side. A lid is bonded to the first side of the supporting structure and open towards the outside in a direction opposite to the supporting structure, the sensor die being housed inside the lid.

In at least one embodiment, a device is provided that includes a supporting structure having a first side and a second side opposite to the first side. The supporting structure defines a cavity extending into the supporting structure from the second side. An environmental sensor die is disposed on the first side of the supporting structure, and a control chip is disposed within the cavity and attached to the supporting structure. A lid is attached to the first side of the supporting structure and open towards the outside in a direction opposite to the supporting structure. The sensor die is housed between the lid and the supporting structure.

BRIEF DESCRIPTION OF THE SEVERAL VIEWS OF THE DRAWINGS

For a better understanding of the disclosure, some embodiments thereof will now be described, purely by way of non-limiting example and with reference to the attached drawings, wherein.

DETAILED DESCRIPTION

Figure 1:
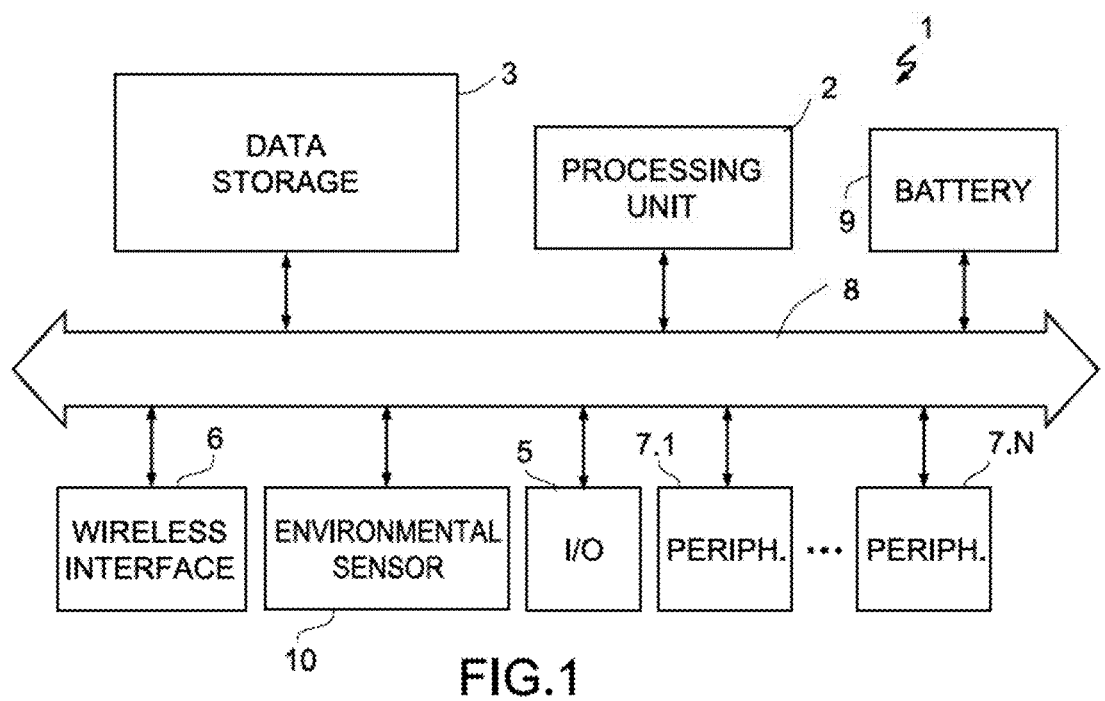
FIG. 1 is a simplified block diagram of an electronic system incorporating a packaged environmental sensor.

With reference to FIG. 1, an electronic device is designated as a whole by the reference number 1 and may be an electronic device of any type, in particular, but not exclusively, a wearable device, such as a watch, a bracelet, or a smart band, a computer, such as a mainframe, a personal computer, a laptop, or a tablet, a smartphone, a digital musical player, a digital camera, or any other device adapted to process, store, transmit, or receive information. The electronic device 1 may be a general-purpose computer system or may be embedded in a device, an apparatus, or a further system.

The electronic device 1 comprises a processing unit 2, data-storage media 3, and a packaged environmental sensor 10, and may moreover be provided with an input/output (I/O) device 5 (for example a keypad, a mouse, or a touchscreen), a wireless interface 6, peripherals 7.1, . . . , 7.N, and possibly further auxiliary devices, here not illustrated. The components of the electronic device 1 may be coupled in communication with one another directly and/or indirectly through a bus 8. The electronic device 1 may moreover comprise a battery 9. It should be noted that the scope of the present disclosure is not limited to embodiments that necessarily have one or all of the devices listed.

The processing unit 2 may comprise, for example, one or more microprocessors, microcontrollers, and the like, according to the design preferences.

The data-storage media 3 may comprise volatile memory devices and non-volatile memory devices of various kinds, for example SRAMs and/or DRAMs in the case of volatile memories, and solid-state memories, and magnetic and/or optical disks in the case of non-volatile memories.

Figure 2:
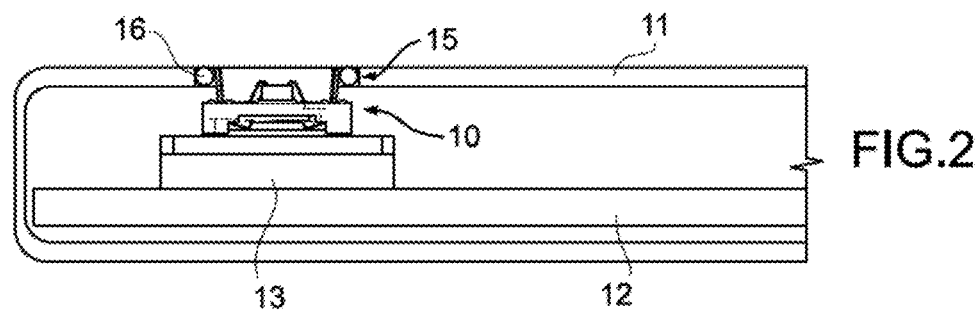
FIG. 2 is a side view, sectioned in a longitudinal plane, of the electronic system of FIG. 1.

With reference to FIG. 2, the electronic device 1 comprises a casing 11 that houses a printed-circuit board (PCB) 12 and at least part of the components. In particular, the packaged environmental sensor 10 is mounted on the PCB 12 either directly or via a socket 13. In addition, the packaged environmental sensor 10 communicates with the outside world through an opening 15 in the casing 11. The gap between the margin of the opening 15 and the packaged environmental sensor 10 is sealed by a gasket 16, for example an O-ring.

The packaged environmental sensor 10 may be any sensor adapted to detect a parameter or magnitude of the external environment. By way of non-limiting example, the packaged environmental sensor 10 may be a pressure sensor, a humidity sensor, a temperature sensor, or some other environmental sensor.

Figure 3:
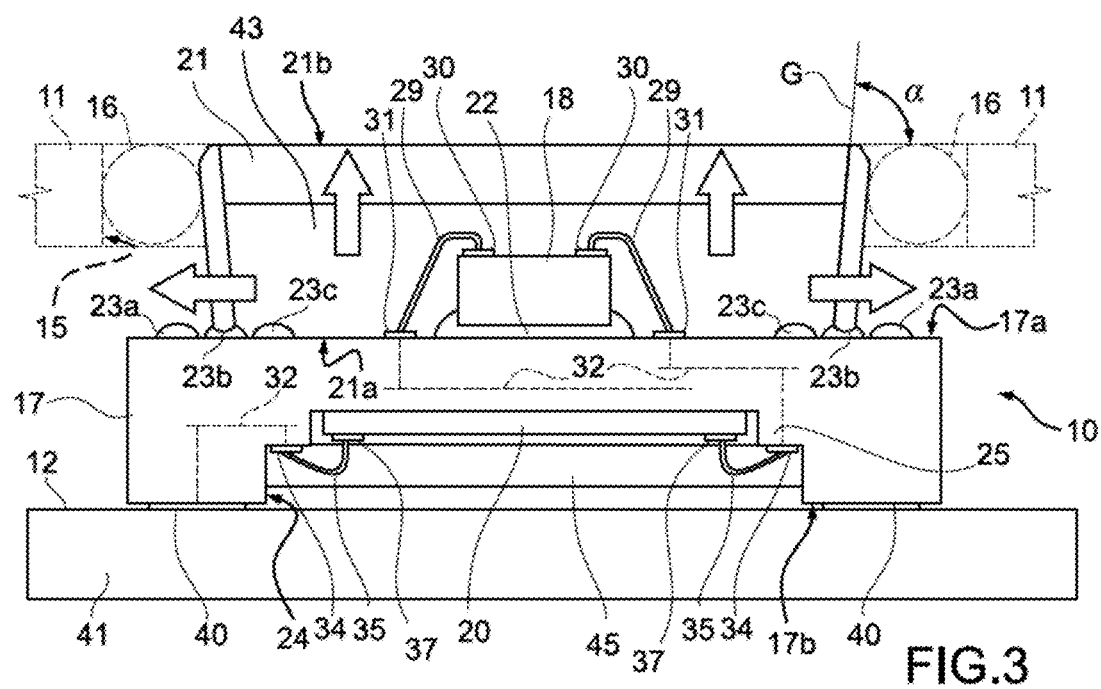
FIG. 3 is a front view, sectioned in the plane of trace III-III of FIG. 4, of a packaged environmental sensor according to one embodiment of the present disclosure incorporated in the electronic system of FIG. 1.
Figure 4:
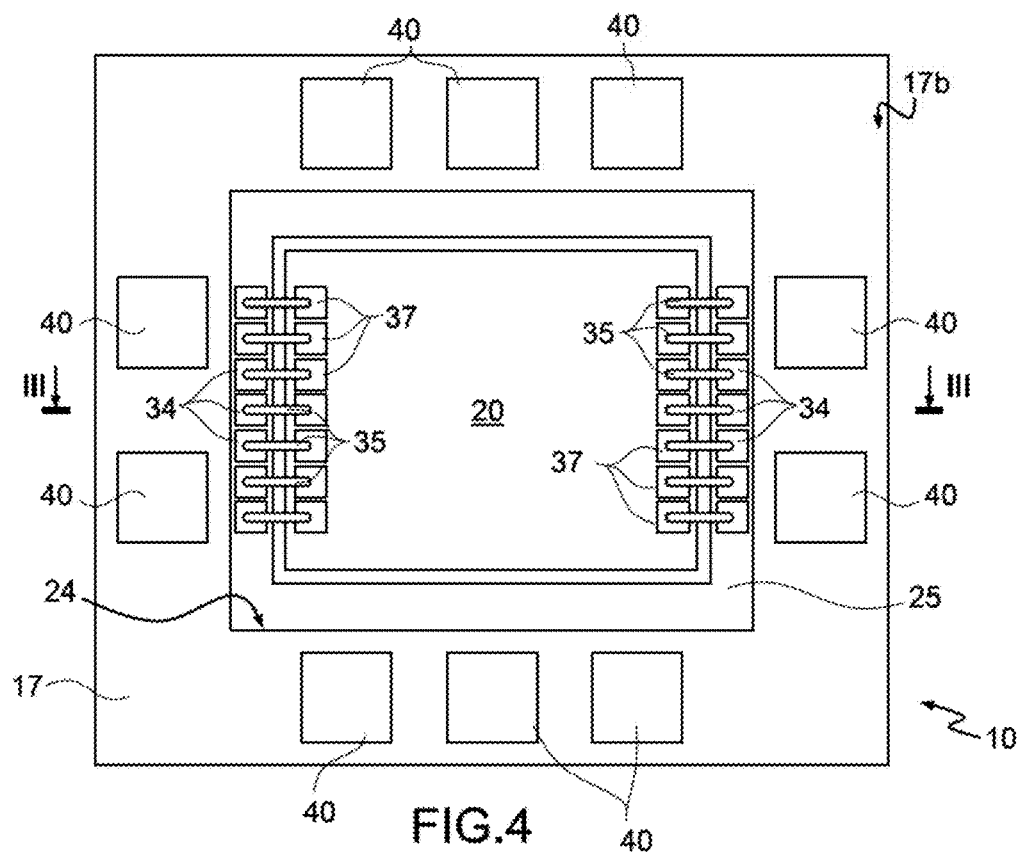
FIG. 4 is a plan view from beneath of the packaged environmental sensor of FIG. 3.
Figure 5:
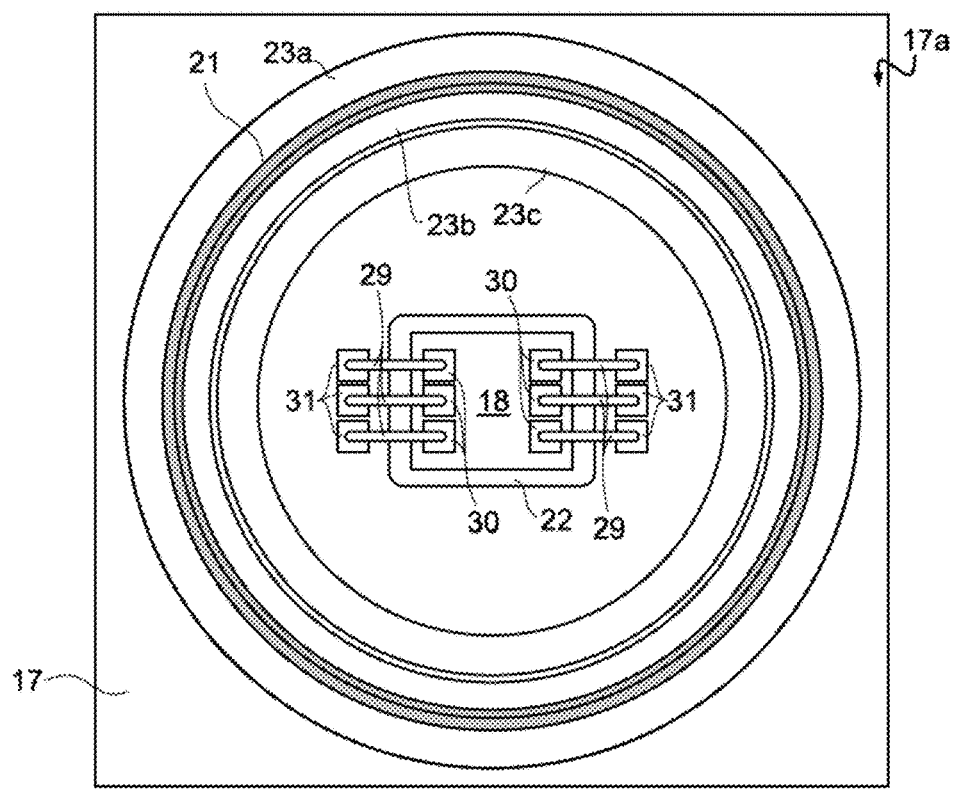
FIG. 5 is a top view of the packaged environmental sensor of FIG. 3.

As shown in FIGS. 3-5, the packaged environmental sensor 10 comprises a supporting structure 17, a sensor die 18, a control or ASIC chip 20, and a collar-shaped lid 21. The lid may be a collar, a ring, or the like.

The supporting structure 17 is, for example, of ceramic and has a first face 17a, to which the sensor die 18 is fixed by a die-attach region 22, and a second face 17b opposite to the first face 17a.

Lid-attach regions 23a-23c, for example, of a metal solder paste, are arranged on the first face 17a of the supporting structure 17 around the sensor die 18. In one embodiment, the lid-attach regions 23a-23c extend along respective closed continuous paths. In particular, the lid-attach regions 23a-23c are in a geometrical relationship of similarity with one another, and one of the lid-attach regions 23a-23c is conformable to a margin of the lid 21 bonded to the supporting structure 17. Furthermore, the lid-attach regions 23a-23c are nested within one another without mutual contact. For instance, the lid-attach regions 23a-23c may be three circular or elliptical concentric rings and are separate from one another. It is understood, however, that the shape and number of the lid-attach regions 23a-23c may be freely selected according to the design preferences, for example so as to correspond to the shape and dimensions of the lids available or in any case used. For instance, the lid-attach regions 23a-23c may have a polygonal shape. In turn, the dimensions of the lids are selected according to the dimensions of the gaskets 16.

The sensor die 18 contains an environmental sensor 19. In particular, the sensor die 18 may contain a MEMS detection structure, for example a membrane structure that may function as pressure sensor or sensor for detecting some other environmental magnitude, such as temperature or humidity.

A cavity 24 is formed in the second face 17b of the supporting structure 17 and houses the control chip 20. In one embodiment, a step 25 is formed around one or more sides of the control chip 20. Consequently, in practice, the control chip 20 is housed in a recess on the bottom of the cavity 24, and therefore on the opposite side of the supporting structure 17 with respect to the sensor die 18. The control chip 20 may comprise control circuits for driving the MEMS structure and for conversion of the physical magnitudes transduced into useful signals.

The sensor die 18 and the control chip are coupled together by bonding wires 29 between contact pads 30 of the sensor die 18 and contact pads 31 on the first face 17a of the supporting structure 17, connection lines 32 embedded in the supporting structure 17 between the contact pads 30 and contact pads 34 on the step 25 of the supporting structure 17 around the control chip 20, and bonding wires 35 between the contact pads 34 and contact pads 37 of the control chip 20. Further contact pads 37, bonding wires 35, contact pads 34, and connection lines 32 connect the control chip to conductive solder pads 40, with which the supporting structure 17 is bonded to a PCB 41. In turn, the PCB 41 is mechanically and electrically coupled to the socket 13 (or directly to the PCB 12 in the absence of the socket 13). Alternatively, the supporting structure 17 can be soldered directly to the PCB 12.

A protective structure 45, for example a glob-top structure, fills at least part of the cavity 24 and incorporates or covers the control chip 20 and the bonding wires 35.

The lid 21 is defined by an annular wall and is bonded to one of the lid-attach regions 23a-23c (in the example of FIG. 3, to the intermediate fixing region 23b, with respect to which the margin of the lid 21 is conformable). In one embodiment, the lid 21 has a frustoconical shape, and its generatrix G forms (externally) an angle α greater than 80° with a plane parallel to the first face 17a of the supporting structure 17. Alternatively, the lid 21 may be cylindrical. The gasket 16 that seals the gap between the margin of the opening 15 of the casing 11 and the packaged environmental sensor 10 is arranged around the lid 21.

The lid 21 is open on both of its bases. The small base 21a of the lid 21 is bonded to the first face 17a of the supporting structure 17 and has a profile conformable to one of the lid-attach regions 23a-23c, in particular to the intermediate lid-attach region 23b. The large base 21b of the lid 21 is open towards the outside in a direction opposite to the supporting structure 17. The height of the lid 21 is such that the sensor die 18 is completely contained within the lid 21.

Moreover, the lid 21 is at least in part filled with a protective layer 43 that completely englobes the sensor die 18 and the bonding wires. The protective layer 43 is of a material that has the characteristics of coupling the sensor die 18 to the environmental magnitude to be measured and, at the same time, protects the sensor die 18, the bonding wires 29, and the pads 31 from aggressive external agents. For instance, the protective layer 43 may a silicone potting gel.

As mentioned, the dimensions of the lid 21 are in relation with the dimensions of the opening 15 to be sealed and of the gasket 16.

Figure 6:
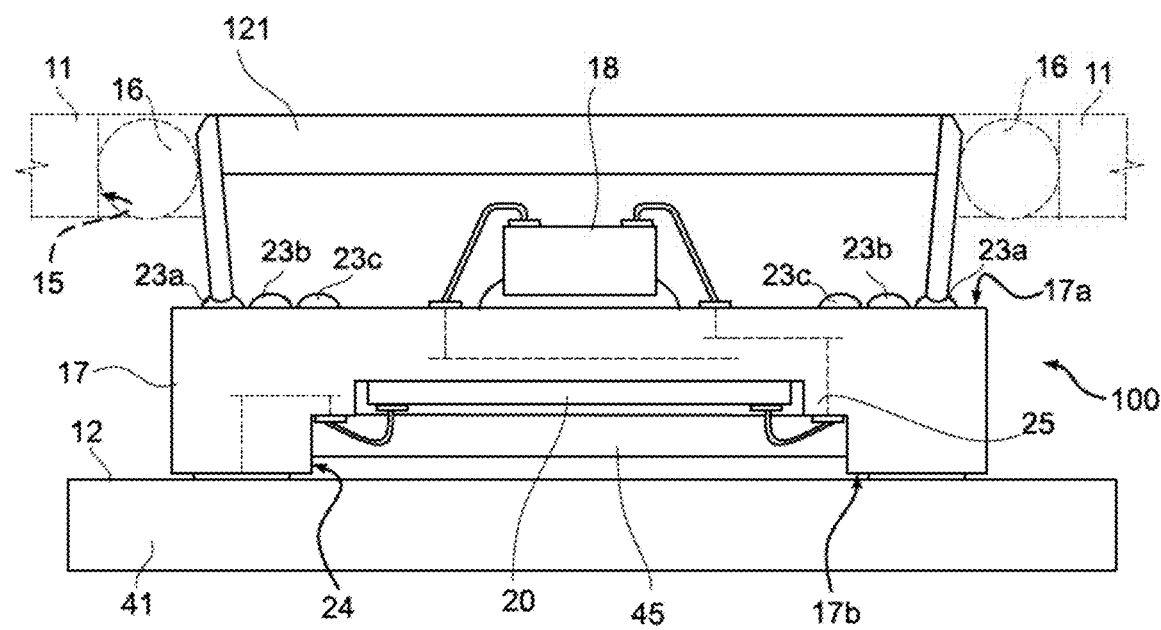
FIG. 6 is a front view, sectioned in a transverse plane, of a packaged environmental sensor according to a different embodiment of the present disclosure that can be used in the electronic system of FIG. 1.

In the embodiment of FIG. 6, a packaged environmental sensor 100 is identical to the packaged environmental sensor 10 already described, except for the dimensions of the lid, which is here designated by the number 121. In this case, the lid 121 has dimensions compatible with those of the outermost lid-attach region 23a and, through the latter, is bonded to the first face 17a of the supporting structure 17.

Figure 7:
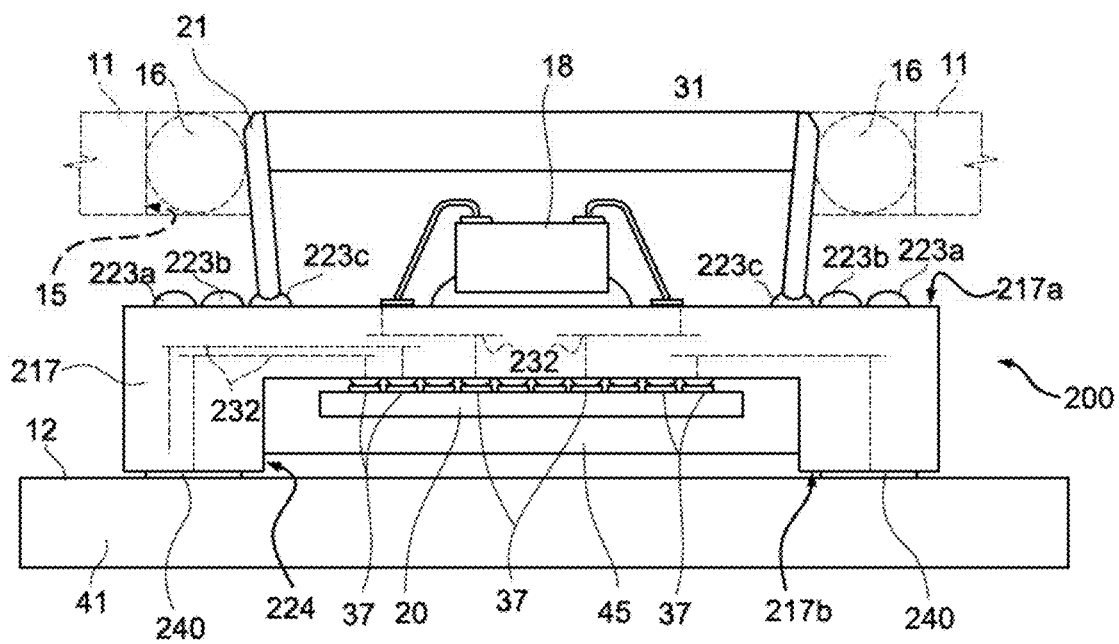
FIG. 7 is a front view, sectioned in a transverse plane, of a packaged environmental sensor according to a further embodiment of the present disclosure that can be used in the electronic system of FIG. 1.

FIG. 7, where elements already described are designated by the same reference numbers, represents a packaged environmental sensor 200 according to a different embodiment of the disclosure. The packaged environmental sensor 200 comprises a supporting structure 217, the sensor die 18, and the control chip 20. In this case, the control chip 20 is bonded to the supporting structure 217 using the flip-chip technique. The cavity 224, which is obtained in the second face 217b of the supporting structure 217 and houses the control chip 20, does not need steps around the control chip 20 itself. Moreover, connection lines 232 connect the contact pads 31 on the first face 217a of the supporting structure 217 to a first set of contact pads 37 of the control chip 20, and a second set of contact pads 37 to solder pads 240 of the supporting structure 217. Formed on the first face 217a of the supporting structure 217 are lid-attach regions 223a-223c, also in this case three having a circular shape and being concentric with respect to one another. The lid 221 is bonded to the innermost lid-attach region 223c.

The packaged environmental sensor described affords several advantages. In the first place, the control chip, which is located on the opposite side of the supporting structure with respect to the sensor die, is enclosed in a space that, in use, may be conveniently sealed with the gasket between the collar and the margin of the opening in the casing of the electronic device, where the packaged environmental sensor is installed. Consequently, the packaged environmental sensor is never exposed to the physically and/or chemically aggressive external environment. Therefore, not only is the control circuit in intrinsically safer conditions as compared to known environmental sensors, but there is also greater freedom of choice of the protective material in which the control circuit is embedded. Furthermore, the control chip is isolated from the external light so as to remain immune therefrom even though its surface may be sensitive to light.

The shape and dimensions of the lid are regardless of the dimensions of the control chip, which has an area that is typically five to six times larger than that of the sensor die. The control chip can be conveniently housed in a cavity of the supporting structure of ceramic, and the dimensions of the lid may be conveniently chosen on the basis of the structural and dimensional characteristics of just the sensor die.

The shape of the lid may be extremely simple because no particular connectors are necessary, as instead happens in some known environmental sensors especially between areas that protect the control chip, which are extensive and have a rectangular shape, and the circular neck for coupling to the O-ring that functions as gasket.

The shape, dimensions, and number of the lid-attach regions may be selected with the highest flexibility according to the design preferences. It is thus possible to produce on a vast scale a large number of examples of the supporting structure itself, to the advantage of manufacturing costs. Given the presence of a plurality of lid-attach regions, the same type of supporting structure can be used with lids and gaskets of various size, without any need for costly interventions of customization.

During the soldering steps, the shape of the lid, whether cylindrical or frustoconical with the small base bonded to the supporting structure, enables accommodation of the higher degree of thermal expansion of the potting material as compared to that of the material forming the lid, without causing damage to the structure itself. As represented by the arrows in FIG. 2, in particular, the forces generated by the different coefficients of thermal expansion in a direction parallel to the first face of the supporting structure are discharged on the side walls, which can withstand the load without any risk. In a direction perpendicular to the first face of the supporting structure, instead, the potting material can expand freely outwards without exerting forces that tend to detach the lid from the supporting structure.

Finally, it is evident that modifications and variations may be made to the packaged environmental sensor described, without thereby departing from the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A packaged environmental sensor, comprising:
 a supporting structure;
 a sensor die, incorporating an environmental sensor and arranged on a first side of the supporting structure;
 a control chip, coupled to the sensor die and arranged on a second side of the supporting structure opposite to the first side; and
 a ring shaped lid bonded to the first side of the supporting structure, the ring shaped lid being in fluid communication with an environment outside and external to the ring shaped lid, and
 wherein the sensor die is housed inside the ring shaped lid.

2. The sensor according to claim 1, further comprising a plurality of lid-attach regions on the first side of the supporting structure around the sensor die, and wherein the ring shaped lid is bonded to the first side of the supporting structure by one of the lid-attach regions.

3. The sensor according to claim 2, wherein the lid-attach regions extend along respective closed continuous paths and are nested inside each other without mutual contact.

4. The sensor according to claim 3, wherein the lid-attach regions are in a mutual geometric relationship of similarity and a lid margin, attached to the supporting structure, is conformal to one of the lid-attach regions.

5. The sensor according to claim 3, wherein the lid-attach regions comprise circular or elliptical concentric rings and are separated from each other.

6. The sensor according to claim 2, wherein the ring shaped lid includes an annular wall having a profile conformal to one of the lid-attach regions.

7. The sensor according to claim 6, wherein the ring shaped lid has a shape of a portion of a solid of revolution.

8. The sensor according to claim 7, wherein the ring shaped lid has a frustoconical shape, with a large base including the opening, which extends through the large base, and a small base bonded to the first side of the supporting structure through one of the lid-attach regions.

9. The sensor according to claim 1, wherein the ring shaped lid is at least partially filled with a protective layer that covers the sensor die.

10. The sensor according to claim 9, wherein the protective layer is of a material that couples the sensor die to an environmental magnitude to be measured.

11. The sensor according to claim 1, wherein the supporting structure has a cavity in the second side and the control chip is housed in the cavity.

12. The sensor according to claim 11, comprising a protective structure covering the control chip inside the cavity.

13. The sensor according to claim 1, wherein the sensor die and the control chip are mutually coupled through connection lines embedded in the supporting structure.

14. An electronic system, comprising:
   a casing;
   a processing unit within the casing; and
   a packaged environmental sensor coupled to the processing unit, the packaged environmental sensor including:
      a supporting structure;
      a sensor die, incorporating an environmental sensor and arranged on a first side of the supporting structure;
      a control chip, coupled to the sensor die and arranged on a second side of the supporting structure opposite to the first side; and
      a ring shaped lid bonded to the first side of the supporting structure, the ring shaped lid being in fluid communication with an environment outside and external to the ring shaped lid, and
      wherein the sensor die is housed inside the ring or collar shaped lid.

15. The electronic system according to claim 14, wherein the casing includes an aperture in the casing aligned with the ring shaped lid, and a gap between a margin of the aperture and the ring shaped lid is sealed by a gasket within the gap.

16. A device, comprising:
   a supporting structure having a first side and a second side opposite to the first side, the supporting structure defining a cavity extending into the supporting structure from the second side;
   a sensor die, incorporating an environmental sensor and arranged on the first side of the supporting structure;
   a control chip, coupled to the sensor die, disposed within the cavity, and attached to and arranged on the second side of the supporting structure; and
   a ring or collar shaped lid attached to the first side of the supporting structure, the ring shaped lid in fluid communication with an environment outside and external to the ring shaped lid, the sensor die being housed within the ring shaped lid attached to the first side of the supporting structure.

17. The device according to claim 16, wherein the control chip is electrically coupled to the environmental sensor die via the supporting structure.

18. The device according to claim 16, further comprising a printed circuit board, wherein the second side of the supporting structure is electrically and physically coupled to the printed circuit board.

19. The device according to claim 16, wherein the ring shaped lid is at least partially filled with a protective layer that covers the sensor die.

20. The device according to claim 16, comprising a protective structure covering the control chip inside the cavity.

* * * * *